(12) United States Patent
Yoshimoto et al.

(10) Patent No.: US 11,929,344 B2
(45) Date of Patent: Mar. 12, 2024

(54) DIE BONDING FOR CHIP CONVEYING APPARATUS

(71) Applicant: DISCO CORPORATION, Tokyo (JP)

(72) Inventors: Hiromitsu Yoshimoto, Tokyo (JP); Zhiwen Chen, Tokyo (JP); Teppei Nomura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/811,213

(22) Filed: Jul. 7, 2022

(65) Prior Publication Data

US 2023/0031977 A1 Feb. 2, 2023

(30) Foreign Application Priority Data

Jul. 28, 2021 (JP) ................. 2021-123711

(51) Int. Cl.
  *H01L 23/00* (2006.01)
(52) U.S. Cl.
  CPC ............. *H01L 24/75* (2013.01); *H01L 24/16* (2013.01); *H01L 2224/16227* (2013.01); *H01L 2224/75263* (2013.01); *H01L 2224/7565* (2013.01); *H01L 2224/75745* (2013.01); *H01L 2224/75753* (2013.01); *H01L 2224/75824* (2013.01)
(58) Field of Classification Search
  CPC ........... H01L 21/67144; H01L 21/6835; H01L 21/6838; H01L 2221/68309; H01L 2221/6835; H01L 2221/68363; H01L 2224/75101; H01L 2224/7565; H01L 2224/75655

See application file for complete search history.

(56) References Cited

U.S. PATENT DOCUMENTS

| | | | |
|---|---|---|---|
| 2003/0060021 A1* | 3/2003 | Kurosawa | ........... H01L 21/6836 438/455 |
| 2023/0031977 A1* | 2/2023 | Yoshimoto | .............. H01L 24/75 |

FOREIGN PATENT DOCUMENTS

JP 2013065629 A 4/2013

* cited by examiner

*Primary Examiner* — Minh N Trinh
(74) *Attorney, Agent, or Firm* — Greer Burns & Crain Ltd.

(57) ABSTRACT

A conveying unit for conveying a device chip onto a predetermined electrode of a board has a chip chuck that holds under suction one surface of the device chip, a support base to which the chip chuck is fixed in an inclinable manner, and a moving unit that moves the support base, in which a fixing mechanism that fixes the chip chuck to the support base has a plurality of leaf springs extending laterally radially from the chip chuck, the plurality of leaf springs are connected to the support base in the surroundings of the chip chuck, and the plurality of leaf springs are pulled one another, so that the chip chuck is supported in air in an inclinable manner.

1 Claim, 12 Drawing Sheets

DIE BONDING FOR CHIP CONVEYING APPARATUS

BACKGROUND OF THE INVENTION

Field of the Invention

The present invention relates to a chip conveying apparatus and a die bonder.

Description of the Related Art

There has been known a die bonder that mounts a semiconductor device chip onto various boards such as a frame board and fixes the semiconductor device chip thereto (see, for example, Japanese Patent Laid-open No. 2013-065629).

SUMMARY OF THE INVENTION

Attendant on the miniaturization of wiring of semiconductor devices, the electrode-to-electrode distance in the semiconductor device chip has also been reduced, and the accuracy of the position in mounting the semiconductor device chip onto a resin board provided with wiring or a silicon wafer provided with wiring by a die bonder is also required to be enhanced. It is typical for the die bonders in the related art that chips are held under suction by a collet at a lower end of a bar-shaped collet holder (head) hanging from a conveying unit. Yet, the die bonders in the related art have had such a problem that, when the collet holder swings, the semiconductor device chip would easily be moved laterally, so that the mounting position thereof would be deviated.

Accordingly, it is an object of the present invention to provide a chip conveying apparatus and a die bonder which are capable of suppressing the deviation of the position where a device chip is fixed.

In accordance with an aspect of the present invention, there is provided a chip conveying apparatus for conveying a device chip to a fixing position of a board, the chip conveying apparatus including a chip chuck that holds under suction one surface of the device chip, a support base to which the chip chuck is fixed in an inclinable manner, a moving unit that moves the support base, and a fixing mechanism that fixes the chip chuck to the support base, in which the fixing mechanism has a plurality of leaf springs extending laterally radially from the chip chuck, and the plurality of leaf springs are connected to the support base in surroundings of the chip chuck, and further, the plurality of leaf springs are pulled by one another, so that the chip chuck is supported in air in an inclinable manner.

Preferably, the chip chuck has a flexible tube connected to a surface on a side opposite to a surface for sucking the device chip, and a negative pressure from a suction source is made to act on the chip chuck through the tube.

In accordance with another aspect of the present invention, there is provided a die bonder for conveying a device chip to a fixing position of a board and heating the device chip with a laser beam to fix the device chip, the die bonder including a chuck table that fixes the board, a chip conveying apparatus that conveys a device chip to the board fixed to the chuck table, and a laser bonding unit that applies a laser beam to the device chip conveyed to the board, to heat the device chip, and heats an electrode of the device chip to connect the electrode to an electrode of the board, in which the chip conveying apparatus includes a chip chuck that holds under suction one surface of the device chip, a support base to which the chip chuck is fixed in an inclinable manner, a moving unit that moves the support base, and a fixing mechanism that fixes the chip chuck to the support base, the fixing mechanism has a plurality of leaf springs extending laterally radially from the chip chuck, the plurality of leaf springs are connected to the support base in surroundings of the chip chuck, and further, the plurality of leaf springs are pulled by one another, so that the chip chuck is supported in air in an inclinable manner.

The present invention produces such an effect that the deviation of the position of fixing a device chip can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not to be limited by the contents of the following embodiment. In addition, the constituent elements described below include those easily conceivable by a person skilled in the art and those which are substantially the same. Further, the configurations described below can be combined, as required, and various omissions, replacements, and modifications of configuration can be performed within such ranges as not to depart from the gist of the present invention.

Figure 1:
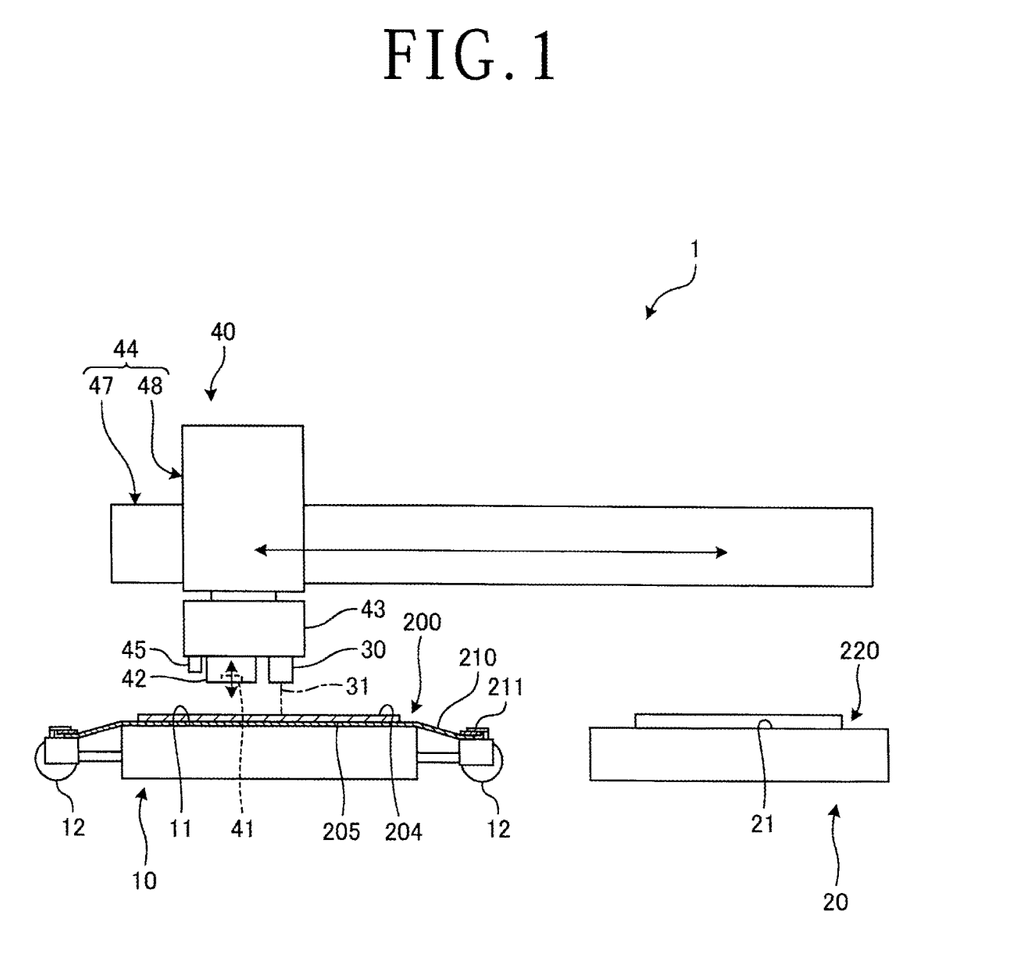
FIG. 1 is a diagram schematically depicting a configuration example of a die bonder according to an embodiment of the present invention.
Figure 2:
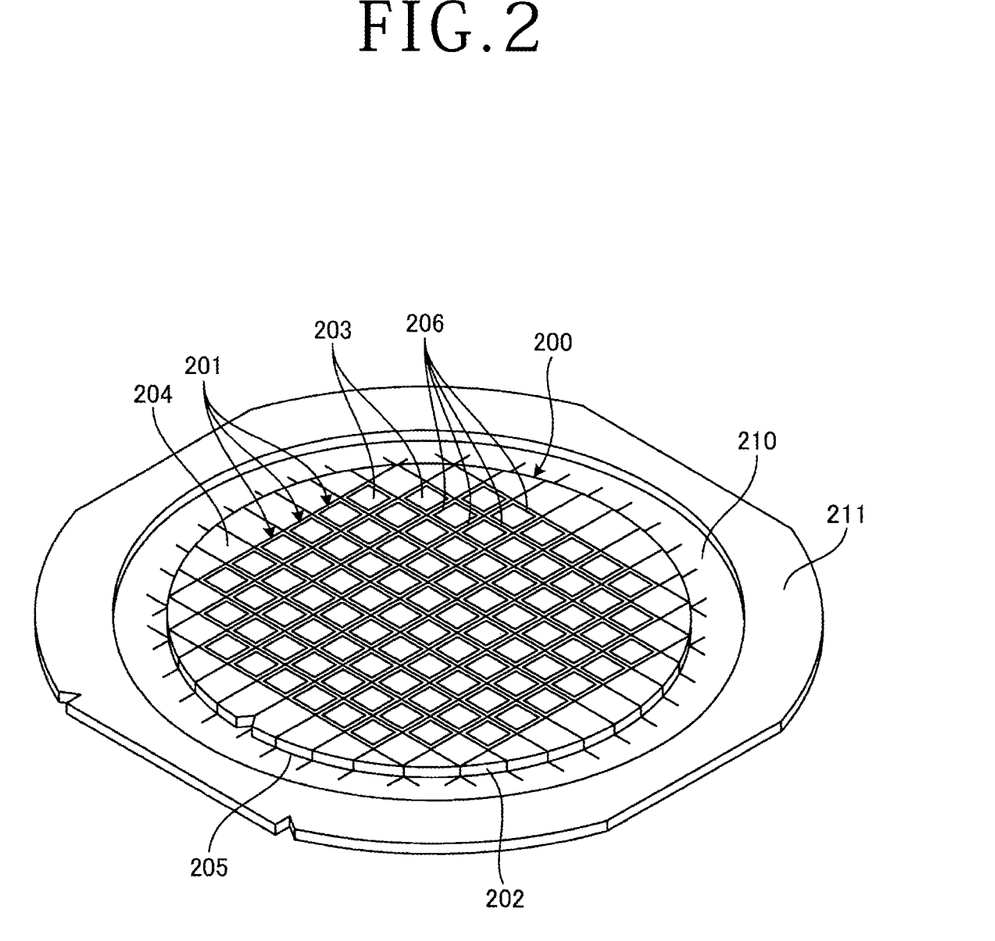
FIG. 2 is a perspective view of a wafer of which a device chip is picked up by a conveying unit of the die bonder depicted in FIG. 1.
Figure 3:
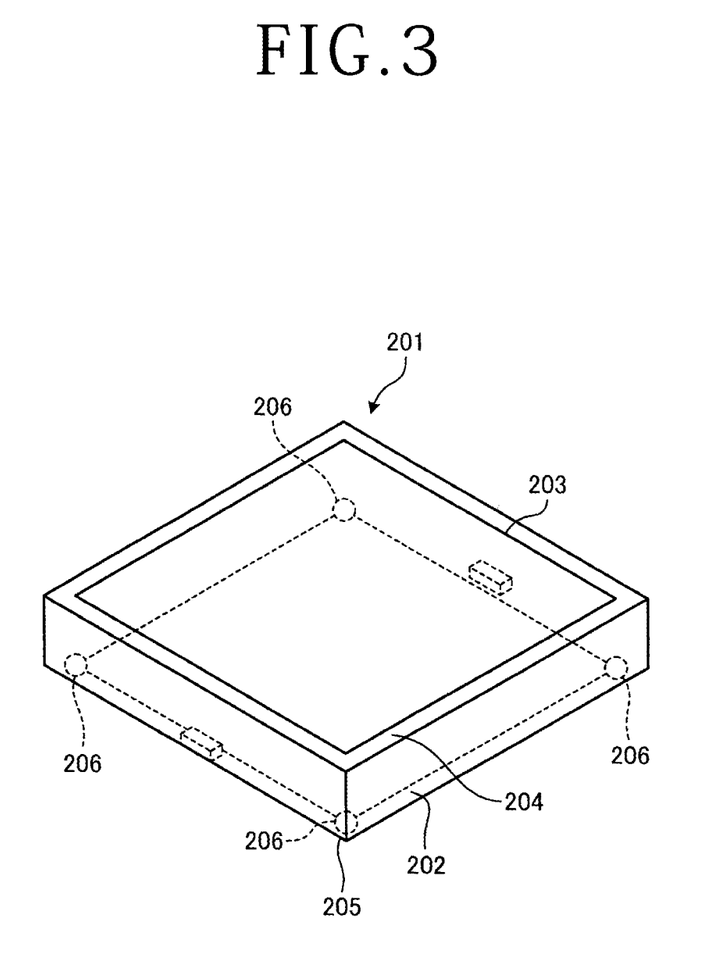
FIG. 3 is a perspective view of the device chip picked up by the conveying unit of the die bonder depicted in FIG. 1.
Figure 4:
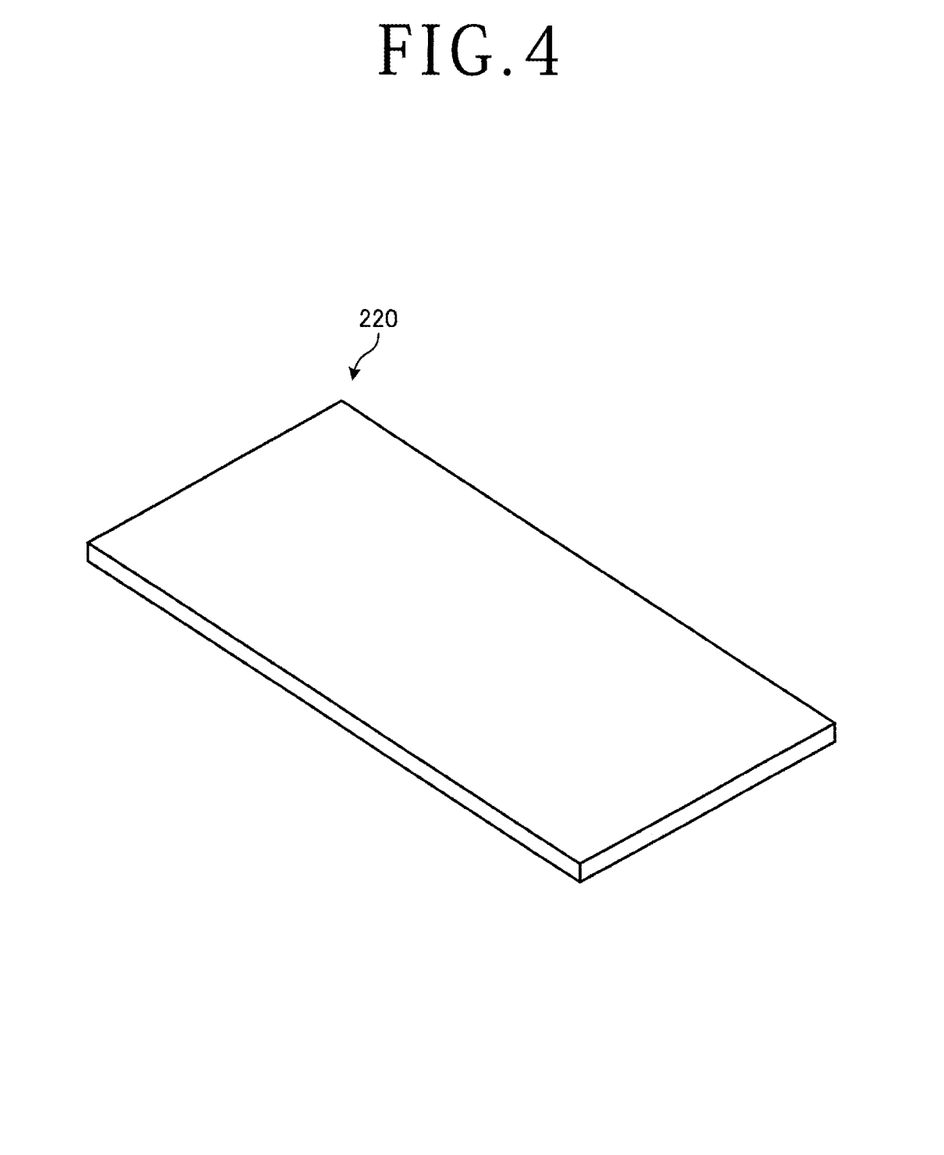
FIG. 4 is a perspective view of a board to which a device chip is mounted by the die bonder depicted in FIG. 1.

A chip conveying apparatus and a die bonder according to an embodiment of the present invention will be descried in reference to the drawings. FIG. 1 is a diagram schematically depicting a configuration example of the die bonder according to the embodiment. FIG. 2 is a perspective view of a wafer of which a device chip is picked up by a conveying unit of the die bonder depicted in FIG. 1. FIG. 3 is a perspective view of the device chip picked up by the conveying unit of the die bonder depicted in FIG. 1. FIG. 4 is a perspective view of a board onto which the device chip is mounted by the die bonder depicted in FIG. 1.

A die bonder 1 depicted in FIG. 1 according to the embodiment is a device that picks up each of device chips 201 depicted in FIG. 3 and individually divided from a wafer 200 depicted in FIG. 2 and mounts the picked-up device chip 201 onto a board 220 depicted in FIG. 4.

(Wafer)

The wafer 200 of which the device chip 201 is picked up by the die bonder 1 depicted in FIG. 1 is a disk-shaped semiconductor wafer or an optical device wafer with a substrate 202 formed of silicon, sapphire, gallium, or the like. The wafer 200 is formed with devices 203 in regions partitioned in a grid pattern by a plurality of streets 207 formed in a grid pattern on a front surface of the substrate 202. In the embodiment, a pressure sensitive adhesive tape 210 with an annular frame 211 attached to a peripheral edge thereof is attached to a back surface 205 on the side opposite to a front surface 204 of the wafer 200, whereby the wafer 200 is supported by the annular frame 211. Besides, the wafer 200 is divided into individual device chips 201 along the streets 207.

(Device Chip)

As depicted in FIG. 3, the device chip 201 has the substrate 202 and the devices 203 formed on the front surface of the substrate 202. In the embodiment, the device chip 201 has an unillustrated through-electrode (also referred to as a through-silicon via (TSV)) in the substrate 202, and has a bump 206 (corresponding to an electrode) which is mounted on the substrate 202 on the back surface 205 side opposite to the front surface 204, on which the device 203 is formed, and which is connected to the through-electrode.

In addition, the device chip 201 has surfaces of the devices 203 protected with an oxide film or the like. Each device chip 201, or the wafer 200, is attached to the pressure sensitive adhesive tape 210 in a state in which copper, solder, or the like is disposed on the bump 206. The same parts of the device chip 201 and the wafer 200 are denoted by the same reference sign in the description. The front surface 204 of the device chip 201 is one surface of the device chip 201.

(Board)

The board 220 is formed in a rectangular shape, has unillustrated electrodes to which the bumps 206 are fixed by solder formed on the front surface thereof, and has a conductor pattern for electrically connecting the electrodes according to a predetermined pattern.

(Die Bonder)

The die bonder 1 is an apparatus for conveying the device chip 201 from the wafer 200 onto a predetermined electrode (corresponding to a fixing position) of the board 220, and heating the device chip 201 by a laser beam 31 to fix the bump 206 to the predetermined electrode, that is, an apparatus for mounting the device chip 201 by fixing it to the predetermined electrode of the board 220. As depicted in FIG. 1, the die bonder 1 has a pick-up table 10, a chuck table 20, a laser bonding unit 30, a conveying unit 40 which is a chip conveying apparatus, and an unillustrated control unit.

The pick-up table 10 is for fixing the wafer 200 on a holding surface 11 parallel to a horizontal direction. The pick-up table 10 is a cylindrical, horizontally movable table, and supports the annular frame 211 on the holding surface 11. The pick-up table 10 is provided in the inside thereof with a chip thrust-up unit for thrusting up the device chip 201 with the pressure sensitive adhesive tape therebetween. An inside space of the pick-up table 10 is connected to an unillustrated vacuum suction source through an unillustrated suction passage. The back surface 205 side of the wafer 200 is mounted on the holding surface 11, with the pressure sensitive adhesive tape 210 therebetween. In the periphery of the pick-up table 10, a plurality of clamps 12 clamping the annular frame 211 that supports the wafer 200 in an opening are disposed. The pick-up table 10, with the inside space being sucked by the vacuum suction source, holds under suction the wafer 200 mounted on the holding surface 11 through the pressure sensitive adhesive tape 210, and clamps the annular frame 211 by the clamps 12. In the pick-up table 10, the chip thrust-up unit thrusts up the device chip 201, with the pressure sensitive adhesive tape 210 therebetween, in a state in which the wafer 200 is held under suction on the holding surface 11.

The chuck table 20 is for fixing the board 220 by a holding surface 21 parallel to a horizontal direction. The holding surface 21 is in a rectangular shape formed from porous ceramic, and is connected to the unillustrated vacuum suction source through the unillustrated suction passage. The board 220 is mounted on the holding surface 21. The chuck table 20, with the holding surface 21 being sucked by the vacuum suction source, holds under suction the board 220 mounted on the holding surface 21, and fixes the board 220 on the holding surface 21.

The laser bonding unit 30 applies the laser beam 31 to the device chip 201 conveyed onto the predetermined electrode of the board 220, to heat the device chip 201, heats the bump 206 of the device chip 201 to once melt the solder, and fixes and connects the bump 206 of the device chip 201 to the electrode of the board 220. Since the laser bonding unit 30 heats each of the device chips 201 fixed to the board 220 by applying the laser beam 31 thereto, the laser bonding unit 30 can change the heating temperature for each device chip 201, and can adjust the energy density of a desired region in the application spot of the laser beam 31. Therefore, the laser bonding unit 30 can perform such an adjustment as applying the laser beam 31 such that energy density is higher in a region where the bumps are present more densely in the device chips 201.

The conveying unit 40 is for picking up the device chip 201 from the wafer 200 held by the pick-up table 10, and for conveying the picked-up device chip 201 onto the predetermined electrode of the board 220 fixed to the chuck table 20.

Figure 5:
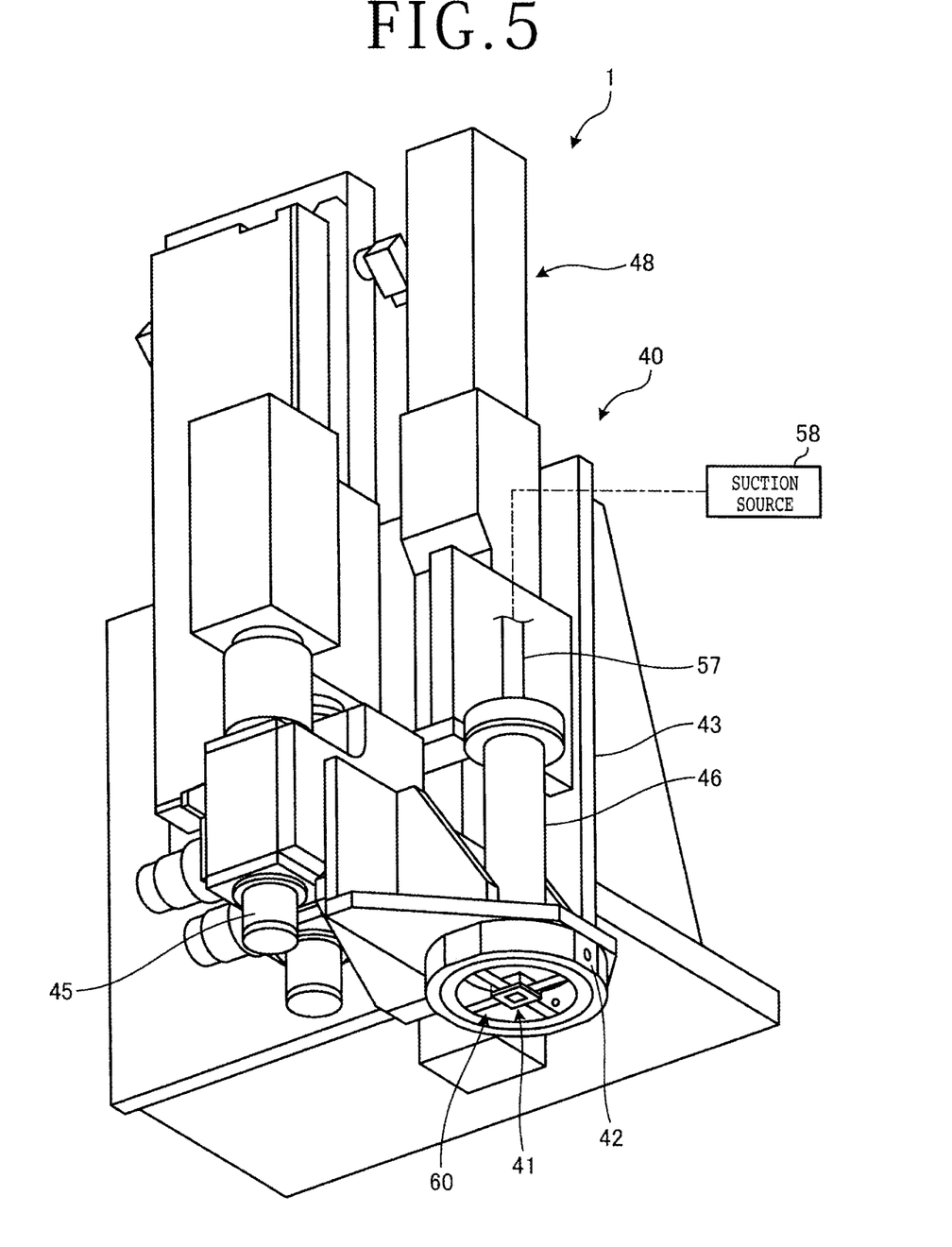
FIG. 5 is a perspective view of the die bonder depicted in FIG. 1.
Figure 6:
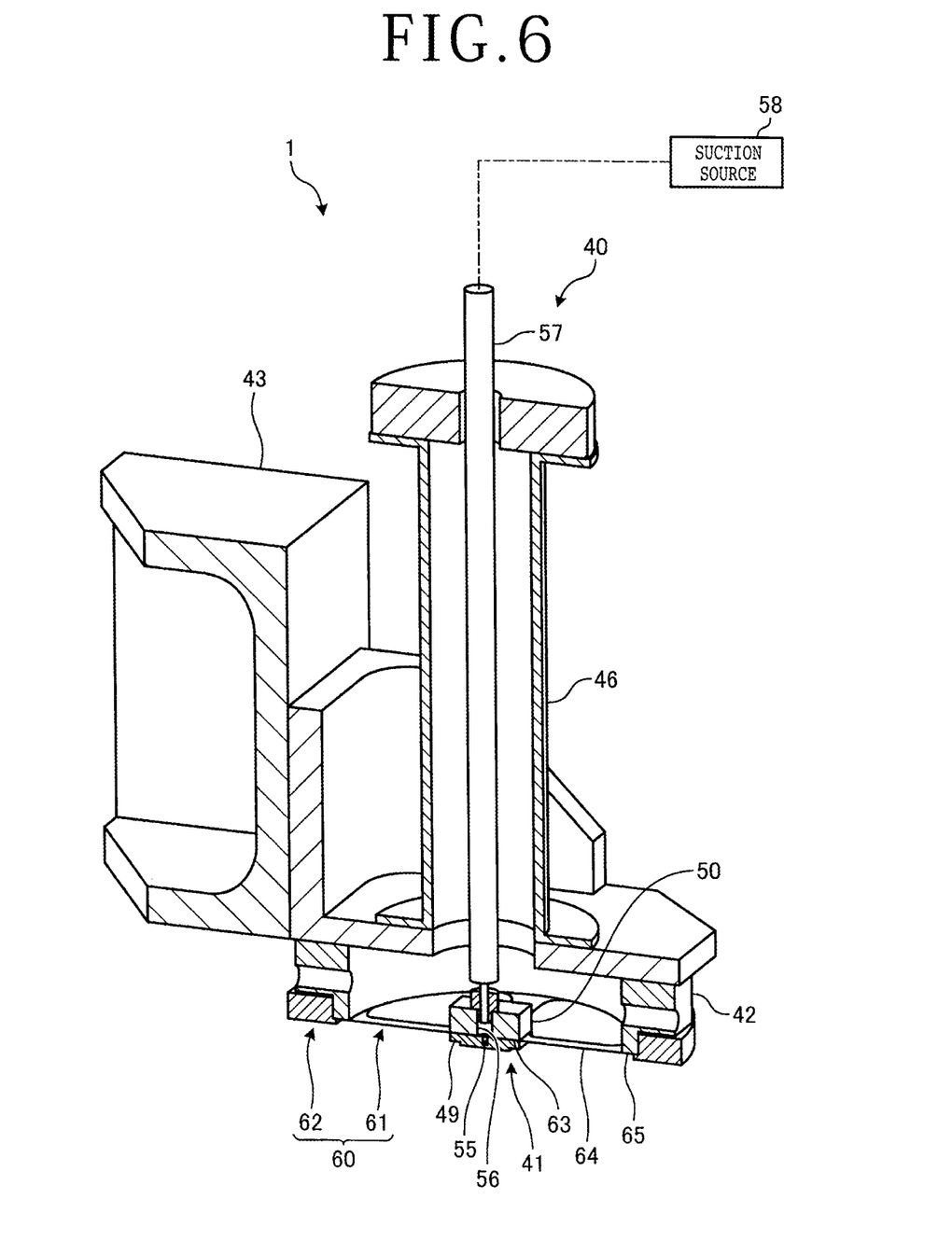
FIG. 6 is a perspective view depicting partly in section the die bonder depicted in FIG. 5.
Figure 7:
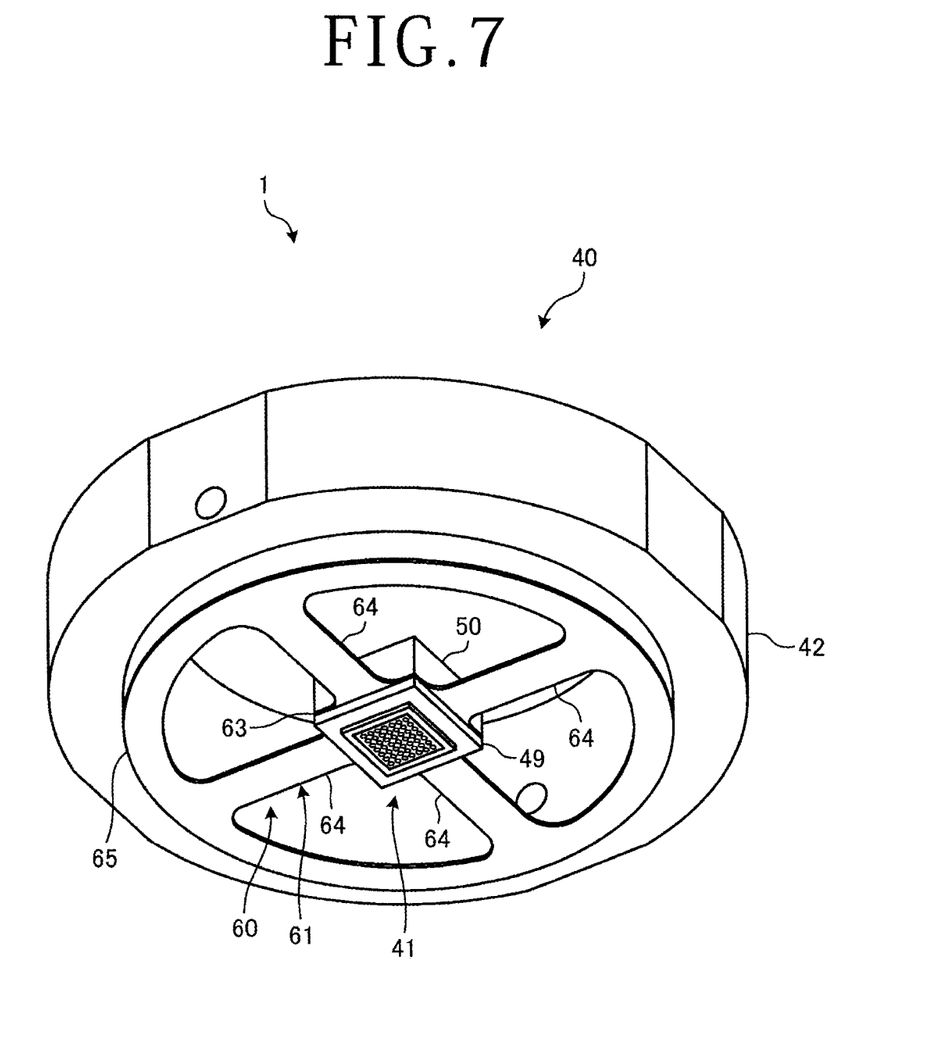
FIG. 7 is a perspective view depicting a support base of the conveying unit depicted in FIG. 5.
Figure 8:
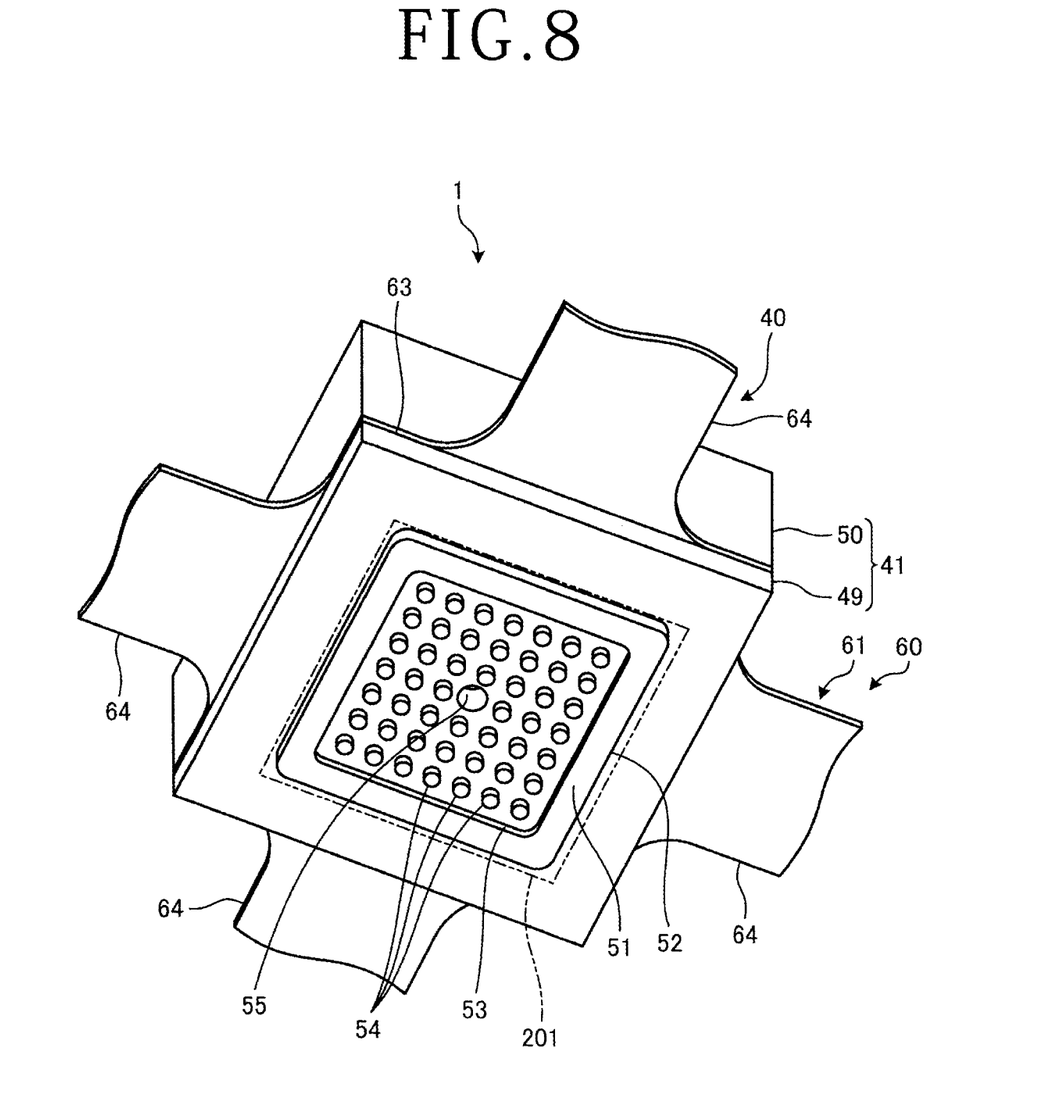
FIG. 8 is a perspective view depicting a fixing mechanism and a chip chuck mounted on the support base depicted in FIG. 7.
Figure 9:
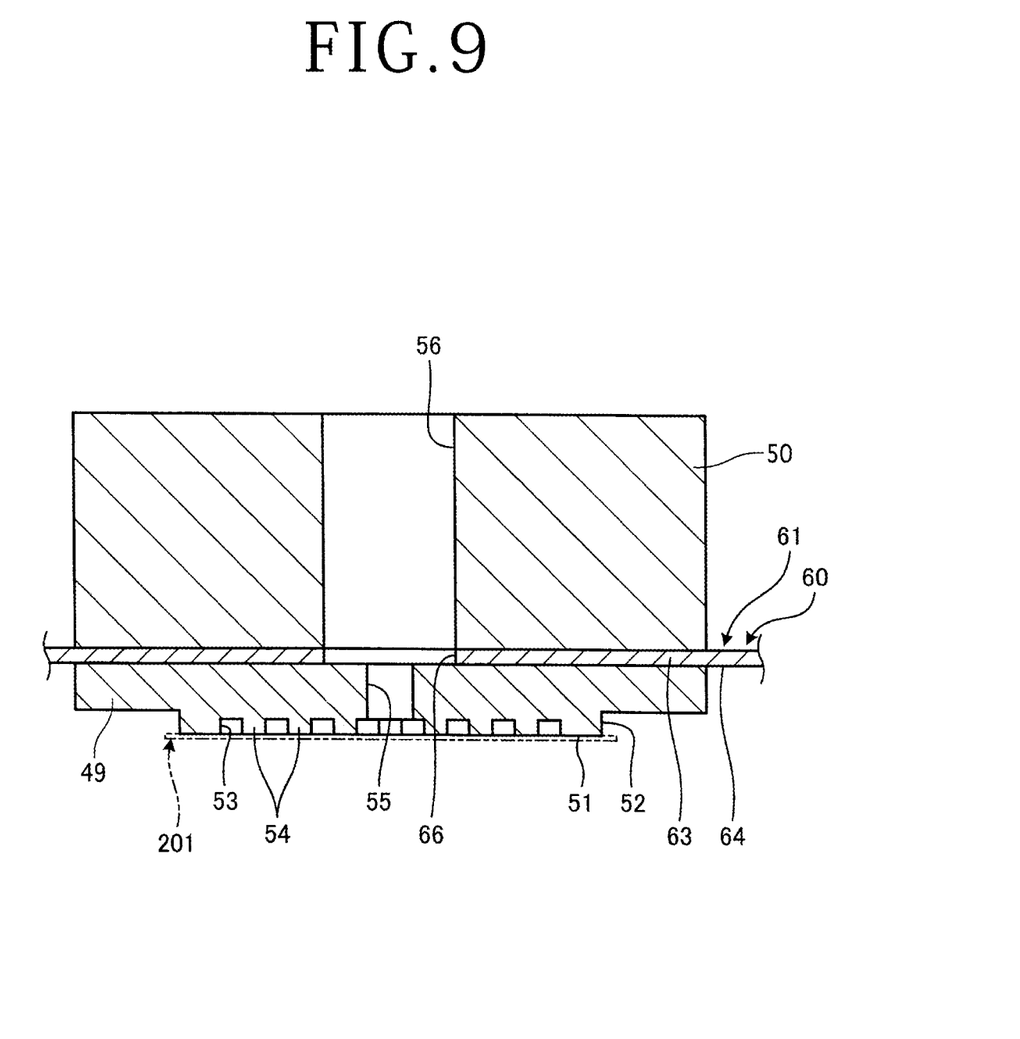
FIG. 9 is a sectional view of the fixing mechanism and the chip chuck depicted in FIG. 8.

Next, the conveying unit 40 will be described in reference to the drawings. FIG. 5 is a perspective view depicting a main body part, the support base, the fixing mechanism, the chip chuck, and the like of the conveying unit of the die bonder depicted in FIG. 1. FIG. 6 is a perspective view depicting, in section, the main body part, the support base, the fixing mechanism, the chip chuck, and the like of the conveying unit depicted in FIG. 5. FIG. 7 is a perspective view depicting the support base, the fixing mechanism, and the chip chuck of the conveying unit depicted in FIG. 5. FIG. 8 is a perspective view depicting the fixing mechanism and the chip chuck depicted in FIG. 7. FIG. 9 is a sectional view of the fixing mechanism and the chip chuck depicted in FIG.

Figure 10:
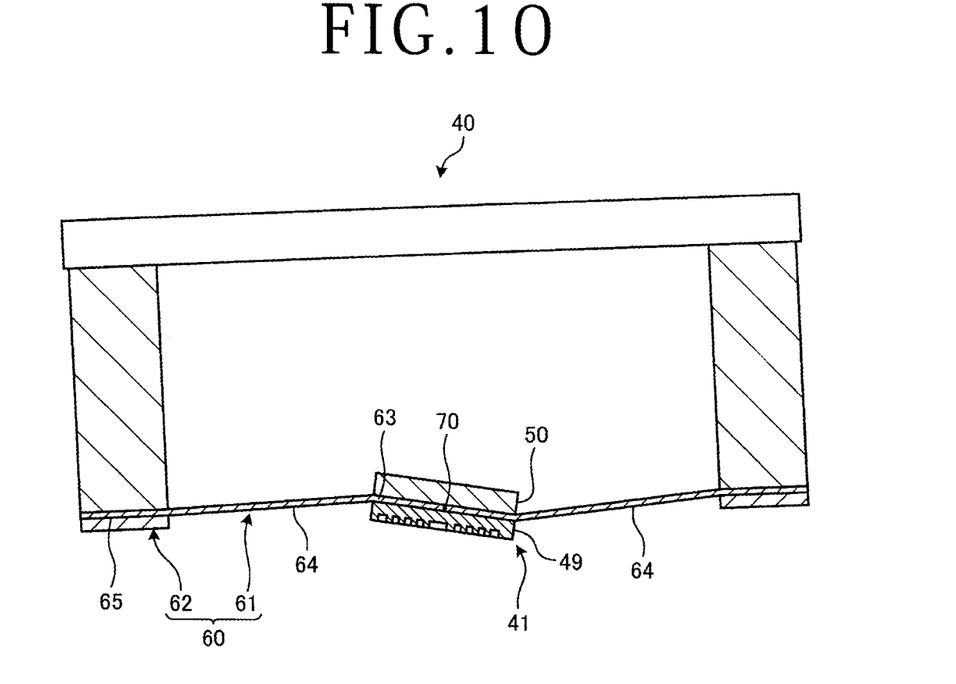
FIG. 10 is a sectional view schematically depicting an inclining state of the chip chuck depicted in FIG. 9.
Figure 11:
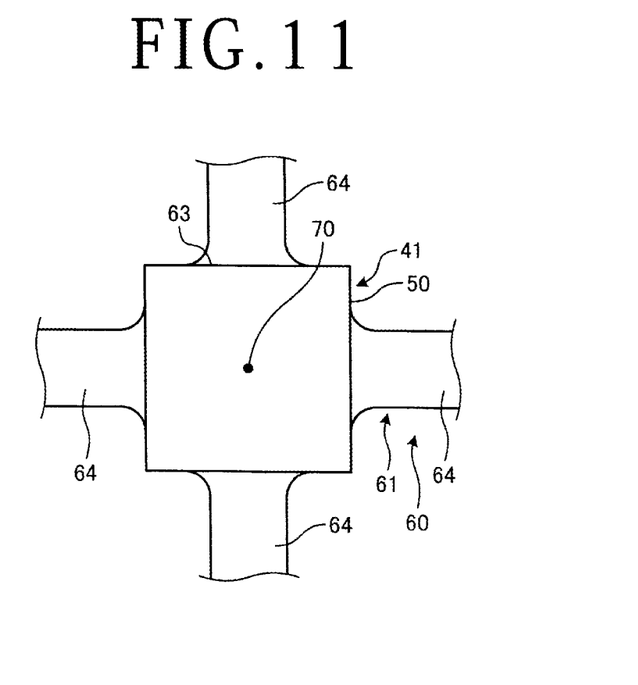
FIG. 11 is a plan view schematically depicting the center of inclination of the chip chuck depicted in FIG. 10.

8. FIG. 10 is a sectional view schematically depicting an inclining state of the chip chuck depicted in FIG. 9. FIG. 11 is a plan view schematically depicting the center of inclination of the chip chuck depicted in FIG. 10.

As depicted in FIG. 1, the conveying unit 40 has a chip chuck 41 that holds under suction the front surface 204 of the device chip 201, the support base 42 to which the chip chuck 41 is fixed in an inclinable manner, the main body part 43 to which the support base 42 and the laser bonding unit 30 are attached, the moving unit 44 that moves the support base 42, a fixing mechanism 60 (depicted in FIG. 5 or the like) that fixes the chip chuck 41 to the support base 42, and a camera unit 45.

As depicted in FIG. 1, the laser bonding unit 30 is attached to the main body part 43. In addition, the main body part 43 integrally has a cylindrical part 46 as depicted in FIGS. 5 and 6.

The moving unit 44 moves the main body part 43 on the upper side of the pick-up table 10 and on the upper side of the chuck table 20, thereby moving the support base 42. As depicted in FIG. 1, the moving unit 44 has a horizontal moving unit 47 and a lifting unit 48. The horizontal moving unit 47 moves the main body part 43, together with the lifting unit 48, on the upper side of the pick-up table 10 and on the upper side of the chuck table 20 along a horizontal direction. The lifting unit 48 lifts up and down the main body part 43, that is, the support base 42, along the vertical direction.

The camera unit 45 is attached to the main body part 43, and images the wafer 200 held by the pick-up table 10 and the board 220 held by the chuck table 20. The camera unit 45 has an imaging element such as a charge coupled device (CCD) imaging element or a complementary metal oxide semiconductor (CMOS) imaging element for imaging the object located on a lower side along the vertical direction. The camera unit 45 may be an infrared (IR) camera; in that case, electrodes of wiring of the board 220 can be imaged, and the bumps 206 on the back surface 205 side of the device chip 201 can also be imaged from the front surface 204 side of the device chip 201, so that alignment between the electrodes of the wiring of the board 220 and the bumps 206 on the back surface 205 side of the device chip 201 can be performed with one camera.

The camera unit 45 acquires an image captured by the imaging element, and outputs the acquired image to the control unit. In addition, the camera unit 45 images the wafer 200 held on the holding surface 11 of the pick-up table 10, and acquires an image for performing alignment between the wafer 200 and the chip chuck 41. It is to be noted that the alignment means positioning the chip chuck 41 in relation to the wafer 200 held by the pick-up table 10, at such a position that only the desired device chip 201 among the plurality of the device chips 201 of the wafer 200 can be held under suction.

In addition, the camera unit 45 images the board 220 held on the holding surface 21 of the chuck table 20, and acquires an image for performing alignment between the board 220 and the chip chuck 41. It is to be noted that the alignment means positioning the chip chuck 41 at such a position that the device chip 201 held by the chip chuck 41 can be mounted on the predetermined electrode of the board 220 held by the chuck table 20.

The support base 42 is formed in a tubular shape. In the embodiment, the support base 42 is formed in an annular shape, as depicted in FIGS. 5, 6, and 7. In the embodiment, the support base 42 has inside and outside diameters greater than the outside diameter of the cylindrical part 46, and is fixed at a lower end of the main body part 43 at such a position as to be coaxial with the cylindrical part 46.

The chip chuck 41 has a chuck member 49 and a suction force transmitting member 50, as depicted in FIGS. 6, 7, 8, and 9. In the embodiment, the chuck member 49 and the suction force transmitting member 50 are formed in a flat plate shape with a planar shape being tetragonal (in the embodiment, square). The thickness of the chuck member 49 is smaller than the thickness of the suction force transmitting member 50.

Of the chip chuck 41, the chuck member 49 is attached to a lower surface of a spring member 61 of the fixing mechanism 60, while the suction force transmitting member 50 is attached to an upper surface of the spring member 61. A lower surface of the chuck member 49 is a support surface 51 (corresponding to a surface for supporting the device chip 201 sucked) opposite to the wafer 200 on the pick-up table 10 and the board 220 on the chuck table 20 along the vertical direction. The support surface 51 is a surface that seals a space between the device chip 201 and a recess, in order to prevent leakage of a negative pressure acting on the recess of the chip chuck 41, and that supports the device chip 201. The chuck member 49 has a recessed part 53 recessed from the support surface 51 with outer edges surrounded by a frame part 52, and a plurality of columnar parts 54 erected from the bottom of the recessed part 53, with a suction hole 55 penetrating the chuck member 49 in the thickness direction. A tip surface of the frame part 52 is the support surface 51. Tip surfaces of the columnar parts 54 are located on the same plane surface as the support surface 51. The suction hole 55 penetrates the center of the chuck member 49, and is open at the bottom of the recessed part 53. Since the chip chuck 41 has the recessed part 53, even if the surface to be sucked of the device chip 201 has some irregularities, the surface can be held under suction.

The suction force transmitting member 50 has a communication hole 56 (depicted in FIGS. 6 and 9) penetrating the center thereof to provide communication with the suction hole 55 of the chuck member 49 though a hole 66 penetrating the spring member 61. The communication hole 56 is open at an upper surface which is a surface on the side opposite to the support surface 51 of the suction force transmitting member 50. As depicted in FIG. 6, the upper surface which is the surface on the side opposite to the support surface 51 of the suction force transmitting member 50 is connected with a tube 57 that communicates with the communication hole 56 and that is formed of a flexible resin or the like. The tube 57 is passed through the inside of the cylindrical part 46 and is connected to the suction source 58.

The chip chuck 41 is connected to the suction source 58 through the tube 57, which is connected to the upper surface of the suction force transmitting member 50 on the side opposite to the support surface 51. The chip chuck 41 brings the front surface 204 of the device chip 201 into contact with the support surface 51, and causes the negative pressure from the suction source 58 to act on the recessed part 53 of the chip chuck 41 through the tube 57, whereby the support surface is sucked and the device chip 201 is held under suction on the support surface 51.

The fixing mechanism 60 includes the spring member 61 and a spring fixing member 62, as depicted in FIG. 6. The spring member 61 is formed in a thin plate form from a known spring steel. Since the spring member 61 is formed from a spring steel, the spring member 61 is elastically deformable. The spring member 61 includes a chuck fixing part 63, a plurality of leaf springs 64, and a leaf spring fixing part 65 in an integrated manner. The chuck fixing part 63 is formed to be tetragonal (in the embodiment, square) in planar shape. In the embodiment, the planar shape of the chuck fixing part 63 is the same as the planar shapes of the chuck member 49 and the suction force transmitting member 50. The chuck fixing part 63 has a hole 66 penetrating the center thereof, a lower surface to which the chuck member 49 is attached, and an upper surface to which the suction force transmitting member 50 is attached.

At least two leaf springs 64 are provided. In the embodiment, four leaf springs 64 are provided. The leaf spring 64 has one end connected with the chuck fixing part 63, and extends rectilinearly in a direction of spacing away from the chuck fixing part 63. In the embodiment, the angle formed between the adjacent leaf springs 64 is 90 degrees. In the present invention, the angle formed between the adjacent leaf springs 64 is an angle calculated by dividing 360 degrees by the number of the leaf springs 64. Thus, the leaf springs 64 are disposed at regular intervals in the circumferential direction from the chuck fixing part 63 with the chuck fixing part 63 as a center, and extend laterally radially from the chip chuck 41 attached to the chuck fixing part 63. The leaf spring fixing part 65 is formed in an annular shape, and couples the other ends of the leaf springs 64 on the side remote from the chuck fixing part 63.

The spring fixing member 62 is formed in an annular shape having the inside and outside diameters equivalent to those of the support base 42, and is attached to the support base 42, with the leaf spring fixing part 65 coupling the other ends of the leaf springs 64 of the spring member 61 being interposed between the spring fixing member 62 and the support base 42. The leaf spring 64 is connected to the support base 42 in the surroundings of the chip chuck 41, with the leaf spring fixing part 65 coupling the other ends of the leaf spring 64 being interposed between the support base 42 and the spring fixing member 62. The spring fixing member 62 fixes the spring member 61 to the support base 42, with the leaf spring fixing part 65 coupling the other ends of the leaf springs 64 of the spring member 61 being interposed between the support base 42 and the spring fixing member 62.

The fixing mechanism 60 has the spring member 61 formed from a spring steel, and particularly the leaf springs 64 of the spring member 61 are elastically deformable. In addition, of the fixing mechanism 60, one end of the leaf spring 64 is contiguous with the chuck fixing part 63 attached to the chip chuck 41, and the other end of the leaf spring 64 is fixed to the support base 42 by the spring fixing member 62. Thus, of the fixing mechanism 60, when the leaf spring 64 is elastically deformed, an elastic restoring force by which the leaf spring 64 pulls both ends of the leaf spring 64 itself is generated. In the fixing mechanism 60, with the elastically deformed leaf spring 64 pulling both ends of itself, the chip chuck 41 is supported in the space inside the support base 42 in an inclinable manner.

It is to be noted that the chip chuck 41 being supported in an inclinable manner in the present invention means that, in any side view along the circumferential direction with the chip chuck 41 as a center, the chip chuck 41 can be rotated around an inclination center 70 (depicted in FIGS. 10 and 11) located at the center in plan view and located at a position of equally bisecting the thickness of the spring member 61, i.e., the leaf spring 64. In a state in which the leaf spring 64 is not elastically deformed, the distance h (depicted in FIG. 12) between the inclination center 70 and the lower surface of the device chip 201 held on the support surface 51 exceeds 0 mm, but is equal to or less than 10 mm, desirably equal to or less than 5 mm, further desirably equal to or less than 2 mm.

The control unit controls each of the abovementioned constituent elements of the die bonder 1, to cause the die bonder 1 to perform a conveying operation for each of the device chips 201 and a fixing operation for the device chips 201. The control unit is a computer having an arithmetic processing device having a microprocessor such as a central processing unit (CPU), a storage device such as a read only memory (ROM) and a random access memory (RAM), and an input-output interface device. The arithmetic processing device of the control unit executes the arithmetic processing according to a computer program stored in the storage device, and outputs control signals for controlling the die bonder 1 to each of the abovementioned constituent elements of the die bonder 1 through the input-output interface device.

In addition, the control unit is connected with a display unit having a display screen for displaying states of the conveying operation and the fixing operation and images and the like, and with input means which is connected to the control unit and which is used at the time when an operator inputs information and the like to the control unit of the die bonder 1.

Figure 12:
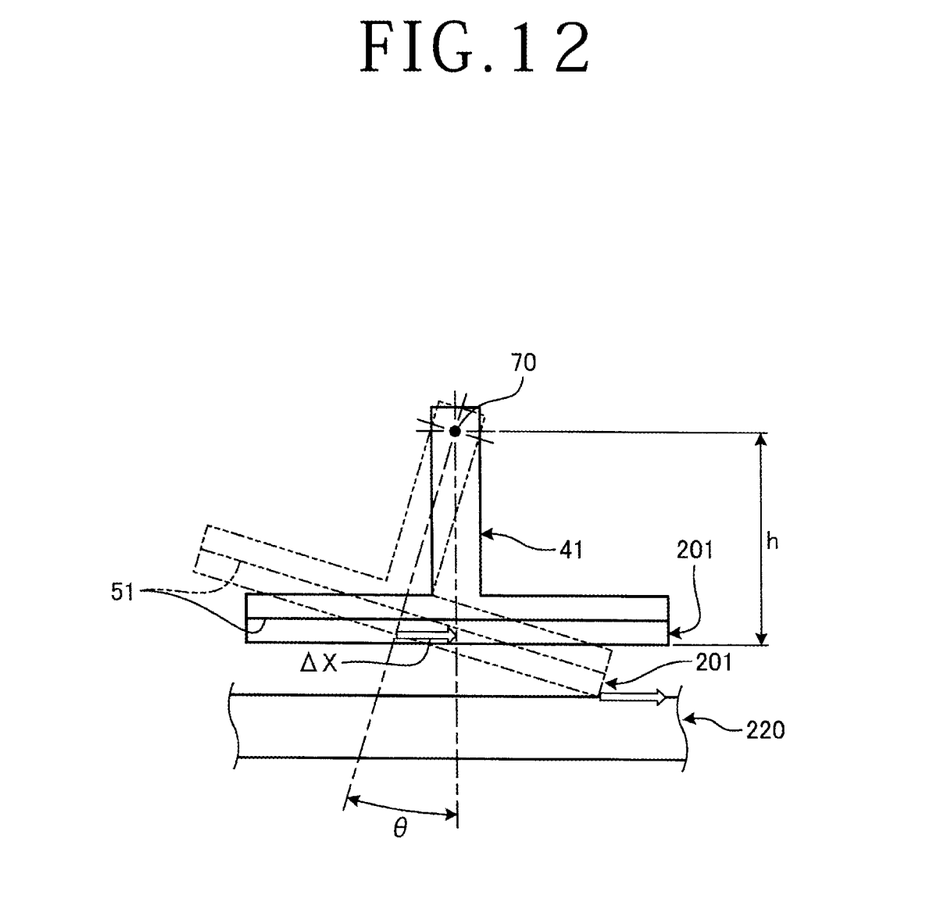
FIG. 12 is a diagram schematically depicting a deviation that occurs when the chip chuck depicted in FIG. 10 places the device chip on the board.
Figure 13:
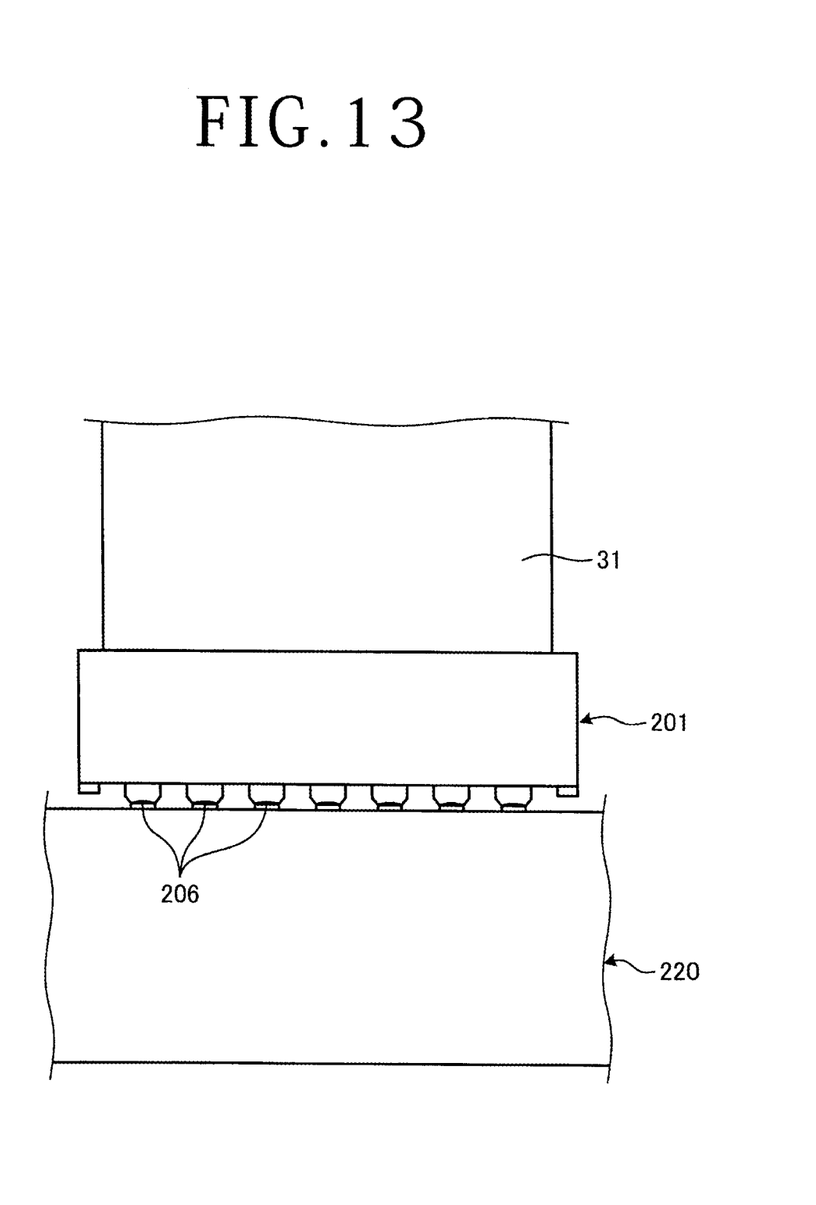
FIG. 13 is a side view schematically depicting the manner in which a laser beam is applied to the device chip placed on board by the chip chuck depicted in FIG. 10.

Next, the conveying operation and the fixing operation of the die bonder 1 according to the embodiment will be described. FIG. 12 is a diagram for schematically explaining a deviation that occurs when the chip chuck depicted in FIG. 10 mounts the device chip on the board. FIG. 13 is a side view schematically depicting a state in which a laser beam is applied to the device chip mounted on the board by the chip chuck depicted in FIG. 10.

In the die bonder 1, the wafer 200 is mounted on the pick-up table 10, the board 220 is mounted on the chuck table 20, and operation conditions are inputted to the control unit through the input means and the like. When the control unit accepts an operator's operation starting signal, the die bonder 1 holds under suction the wafer 200 on the holding surface 11 of the pick-up table 10, and holds under suction the board 220 on the holding surface 21 of the chuck table 20.

In the die bonder 1, the control unit controls the moving unit 44 to position the camera unit 45 on the upper side of the wafer 200 on the pick-up table 10, causes the camera unit 45 to image the wafer 200 on the pick-up table 10, performs alignment between the chip chuck 41 and the wafer 200, and brings the support surface 51 of the chip chuck 41 into contact with the device chip 201 as an object to be conveyed. In the die bonder 1, the control unit holds under suction the device chip 201 as the object to be conveyed on the support surface 51 of the chip chuck 41, controls the moving unit 44 to pick up from the pressure sensitive adhesive tape 210 the device chip 201 to be conveyed which is held under suction on the support surface 51 of the chip chuck 41, and positions the camera unit 45 on the upper side of the board 220 of the chuck table 20.

In the die bonder 1, the control unit causes the camera unit 45 to image the board 220 on the chuck table 20, performs alignment between the chip chuck 41 and the board 220, and positions the device chip 201 held under suction on the support surface 51 of the chip chuck 41 onto a predetermined electrode of the board 220. In the die bonder 1, the control unit controls the moving unit 44, to lower the device chip 201 held under suction on the support surface 51 of the chip chuck 41.

In this instance, in the case where the board 220 and the chip chuck 41 holding under suction the device chip 201 are inclined as depicted in FIG. 10, a corner of the device chip 201 held under suction by the chip chuck 41 makes contact with the board 220, and, as the device chip 201 is lowered, the leaf spring 64 is elastically deformed such that the device chip 201 becomes parallel to the board 220. Then, when the device chip 201 is mounted on the board 220, the device chip 201 becomes parallel to the board 220.

The distance from the inclination center 70 of the chip chuck 411 to the support surface 51 and the deviation of the device chip 201 relative to the board 220 will be described. With the inclination of the chip chuck 41 relative to the substrate 202 varied from the position indicated in a dotted line in FIG. 12 to the position indicated in a solid line, the device chip 201 is moved and deviated by ΔX along the board 220.

This deviation ΔX which is the moving distance of the device chip 201 can be represented by the following formula 1, using the abovementioned distance h and variation el of the inclination of the chip chuck 41 relative to the board 220 from the position indicated by the dotted line in FIG. 12 to the position indicated by the solid line.

$$\Delta X = h \sin \theta \qquad \text{Formula 1}$$

The die bonder 1, upon mounting the device chip 201 on the predetermined electrode of the board 220, stops holding under suction the device chip 201 on the support surface 51, and the control unit controls the moving unit 44 to raise the chip chuck 41. The die bonder 1 controls the moving unit 44 to have the laser bonding unit 30 be opposite to the device chip 201 mounted on the predetermined electrode of the board 220, and, thereafter, as depicted in FIG. 13, applies a laser beam 31 from the laser bonding unit 30 to the device chip 201, to thereby fix the device chip 201 to the board 220.

The die bonder 1, upon conveying the device chips 201 determined under operating conditions sequentially to the board 220 and fixing the device chips 201 to the board 220, finishes the conveying operation and the fixing operation.

As described above, the conveying unit 40 and the die bonder 1 according to the embodiment attaches the chuck member 49 of the chip chuck 41 to a lower surface of the leaf spring 64 supporting the chip chuck 41 in an inclinable manner, so that the abovementioned distance h can be suppressed.

As a result, the conveying unit 40 and the die bonder 1 produces such an effect that the deviation ΔX of the position of fixing the device chip 201 can be suppressed according to the formula 1.

In addition, the conveying unit 40 and the die bonder 1 according to the embodiment are configured to be suspended by the leaf springs 64 which extend laterally radially from the chip chuck 41 holding under suction the device chip 201 and which pull one another, so that the deviation ΔX of the chip chuck 41 in the lateral direction can be suppressed, and, since the chip chuck 41 can be moved in the vertical direction, the conveying unit 40 and the die bonder 1 also produce such an effect that the shock caused by the device chip 201 being mounted on the board 220 can be absorbed.

Particularly, the conveying unit 40 and the die bonder 1 according to the embodiment ensure that, by making as small as possible the height difference between the support surface 51 of the chip chuck 41 holding under suction the device chip 201 and the leaf spring 64, the deviation ΔX of the device chip 201 in the lateral direction is made as small as possible, even if the chip chuck 41 is inclined.

For example, in the case where the variation θ of the inclination is 0.01 rad, the conveying unit 40 and the die bonder 1 according to the embodiment can, by setting the distance h to be equal to or less than 0.5 mm, make the deviation ΔX be equal to or less than 5 μm according to formula 1.

Note that the present invention is not limited to the abovementioned embodiment and the like. The present invention can be carried out with various modifications within such ranges as not to depart from the gist of the invention. In the present invention, adoptable is what is generally called flip chip bonding in which the back surface 205 on the side opposite to the device surface of the device chip 201 is held under suction by the support surface 51 of the chip chuck 41, and is disposed on the board 220.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A die bonder for conveying a device chip to a fixing position of a board and heating the device chip with a laser beam to bond the device chip to the board, the die bonder comprising:
   a chuck table that fixes the board;
   a chip conveying unit that conveys a device chip to the board fixed to the chuck table; and
   a laser bonding unit that applies a laser beam to the device chip conveyed to the board, to heat the device chip, and heats an electrode of the device chip to connect the electrode to an electrode of the board,
   wherein the chip conveying unit includes:
      a chip chuck that holds under suction one surface of the device chip,
      a support base to which the chip chuck is fixed in an inclinable manner,
      a moving unit that moves the support base, and
      a fixing mechanism that fixes the chip chuck to the support base,
   the fixing mechanism has a plurality of leaf springs extending laterally radially from the chip chuck, and
   the plurality of leaf springs are connected to the support base in surroundings of the chip chuck, and the plurality of leaf springs are configured to pull by one another, so that the chip chuck is supported in air in an inclinable manner.

* * * * *